(12) United States Patent
Tang et al.

(10) Patent No.: US 8,484,607 B1
(45) Date of Patent: Jul. 9, 2013

(54) DECOMPOSING LAYOUT FOR TRIPLE PATTERNING LITHOGRAPHY

(75) Inventors: Xiaoping Tang, Mohegan Lake, NY (US); Xin Yuan, Roseville, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/413,288

(22) Filed: Mar. 6, 2012

(51) Int. Cl.
*G06F 15/04* (2006.01)
*G06F 17/50* (2006.01)

(52) U.S. Cl.
USPC .......................................................... 716/136

(58) Field of Classification Search
USPC .......................................................... 716/139
See application file for complete search history.

(56) References Cited

U.S. PATENT DOCUMENTS

| | | | |
|---|---|---|---|
| 6,981,241 B2 | 12/2005 | Ludwig et al. | |
| 7,030,885 B2 | 4/2006 | Kim et al. | |
| 7,913,197 B1 | 3/2011 | Kruger et al. | |
| 8,069,423 B2 | 11/2011 | Ghan et al. | |
| 2008/0307381 A1* | 12/2008 | Tritchkov et al. | 716/11 |
| 2010/0021055 A1 | 1/2010 | Socha | |
| 2011/0014786 A1 | 1/2011 | Sezginer et al. | |
| 2011/0055169 A1* | 3/2011 | Yalamanchi | 707/690 |
| 2011/0078638 A1 | 3/2011 | Kahng et al. | |

OTHER PUBLICATIONS

Li et al., "14nm M1 Triple Patterning," Feb. 2012, 7 pages, SPIE Publications, Proceedings vol. 8326, Optical Microlithography XXV.
Yu et al., "Layout Decomposition for Triple Patterning Lithography," Nov. 2011, pp. 1-8, Computer-Aided Design (ICCAD), 2011 IEEE/ACM International Conference.
Kahng et al., "Layout Decomposition for Double Patterning Lithography," Nov. 2008, pp. 465-472, Computer-Aided Design (ICCAD), 2008 IEEE/ACM International Conference.
Yuan et al., "Double Patterning Layout Decomposition for Simultaneous Conflict and Stitch Minimization," Apr. 2009, pp. 107-114, Proceedings of the 2009 International Symposium on Physical Design (ISPD '09).
Yuan et al., "Double Patterning Layout Decomposition for Simultaneous Conflict and Stitch Minimization," Feb. 2010, pp. 185-196, IEEE Transactions on Computer-Aided Design of Integrated Circuits and Systems, vol. 29, No. 2.
Yang et al., "A New Graph-Theoretic, Multi-Objective Layout Decomposition Framework for Double Patterning Lithography," Jan. 2010, pp. 637-644, Design Automation Conference (ASP-DAC), 2010 15th Asia and South Pacific.
Xu et al., "GREMA: Graph reduction Based Efficient Mask Assignment for Double Patterning Technology," Nov. 2009, pp. 601-606, Computer-Aided Design (ICCAD), 2009 IEEE/ACM International Conference.
Xu et al., "A Matching Based Decomposer for Double Patterning Lithography," Mar. 2010, Apr. 2009, pp. 121-126, Proceedings of the 2010 International Symposium on Physical Design (ISPD '10).

* cited by examiner

*Primary Examiner* — Suresh Memula
(74) *Attorney, Agent, or Firm* — Richard M. Kotulak; Hoffman Warnick LLC (57) ABSTRACT

An approach for decomposing a layout for triple patterning lithography is described. In one embodiment, a triple patterning conflict graph is built from a layout having pattern features specified as shapes. The triple patterning conflict graph represents the shapes in the layout and coloring constraints associated with the shapes. The shapes represented by the triple patterning conflict graph are decomposed into three colors to avoid color conflict, while balancing the color density among the three colors and minimizing a number of stitches used to represent the shapes in the layout. Color conflicts in the decomposition are resolved by selectively segmenting the shapes in the decomposition that are associated with the color conflict.

20 Claims, 6 Drawing Sheets

DECOMPOSING LAYOUT FOR TRIPLE PATTERNING LITHOGRAPHY

BACKGROUND

The present invention relates generally to the design and manufacture of integrated circuits, and more specifically, to decomposing a layout for triple patterning lithography.

An integrated circuit ("IC") is a device (e.g., a semiconductor device) or electronic system that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components.

Design engineers typically design ICs by transforming logical or circuit descriptions of the ICs' components into geometric descriptions, called design layouts. IC design layouts typically include: (1) circuit modules (i.e., geometric representations of electronic or circuit IC components) with pins, and (2) interconnect lines (i.e., geometric representations of wiring) that connect the pins of the circuit modules. A net is typically defined as a collection of pins that need to be connected. In this fashion, design layouts often describe the behavioral, architectural, functional, and structural attributes of the IC.

To create the design layouts, design engineers typically use electronic design automation ("EDA") applications. These applications provide sets of computer-based tools for creating, editing, analyzing, and verifying design layouts.

Fabrication foundries ("fabs") manufacture ICs based on the design layouts using a photolithographic process. Photolithography is an optical printing and fabrication process by which patterns on a photolithographic mask (i.e., photomask) are imaged and defined onto a photosensitive layer coating a substrate. To fabricate an IC, photomasks are created using the IC design layout as a template. The photomasks contain the various geometries (i.e., features) of the IC design layout. The various geometries contained on the photomasks correspond to the various base physical IC elements that comprise functional circuit components such as transistors, interconnect wiring, via pads, as well as other elements that are not functional circuit elements, but that are used to facilitate, enhance, or track various manufacturing processes. Through sequential use of the various photomasks corresponding to a given IC in an IC fabrication process, a large number of material layers of various shapes and thicknesses with various conductive and insulating properties may be built up to form the overall IC and the circuits within the IC design layout.

Constraining factors in traditional photolithographic processes limit their effectiveness as circuit complexity continues to increase and transistor designs become more advanced and ever smaller in size (i.e., die shrink). Some such constraining factors are the lights/optics used within the photolithographic processing systems. Specifically, the lights/optics are band limited due to physical limitations (e.g., wavelength and aperture) of the photolithographic process. Therefore, the photolithographic process cannot print beyond a certain pitch, distance, and other such physical manufacturing constraints.

A pitch specifies a sum of the width of a feature and the space on one side of the feature separating that feature from a neighboring feature. Depending on the photolithographic process at issue, factors such as optics and wavelengths of light or radiation restrict how small the pitch may be made before features can no longer be reliably printed to a wafer or mask. As such, the smallest size of any features that can be created on a wafer is severely limited by the pitch.

With the advance of ultra deep submicron technology, the feature size and feature pitch get so small that existing lithography processes meet their bottleneck in printing the shapes represented by the features. On the other hand, there are difficulties in the practical use of advanced photolithographic processes (e.g., extreme ultra violet (EUV)). Therefore, the current lithography technology is expected to be used for next generation silicon technology. To compensate for the difficulty in printing the shape of small pitches, multiple patterning lithography is recognized as a promising solution for 32 nm, 22 nm and sub-22 nm (e.g., 16 nm) volume IC production. Multiple patterning lithography technology generally decomposes a single layer of a layout into multiple masks and applies multiple exposures to print the shapes in the layer. The decomposition provided by multiple patterning lithography increases shape printing pitch and improves the depth of focus.

Double patterning lithography is one type of multiple patterning lithography technology that has been in use for some time. Double patterning lithography generally involves placing shapes that are too close to each other to be assigned to the same mask layer, onto two different mask layers in order to satisfy spacing requirements specified in the design layout. These two different mask layers are then used to print one design layer. However, for a dense layer of a layout (e.g. a first metal level (M1)), the double patterning lithography is not enough to print the shapes of the layer while maintaining the M1 pitch spacing requirements. This gives rise to explore other multiple patterning lithography options such as triple patterning lithography.

SUMMARY

In one embodiment, there is a method, performed on a computing device having at least one processing unit that decomposes a layout for triple patterning lithography. This method comprises using the at least one processing unit of the computing device to perform actions comprising: receiving the layout with pattern features in the layout specified as shapes; building a triple patterning conflict graph that represents the shapes in the layout and coloring constraints associated with the shapes, wherein the triple patterning conflict graph includes a plurality of nodes each representing a plurality of shapes in the layout, conflict arcs coupled to nodes that have color conflicts that arise when the shapes represented by the nodes are assigned to the same color, and stitch arcs coupled to nodes that represent shapes stitched together; decomposing the shapes represented by the triple patterning conflict graph into three colors to avoid color conflicts while balancing color density among the three colors and minimizing a number of stitches used to represent the shapes in the layout; determining whether the decomposition of the shapes into the three colors results in a color conflict; and in response to determining that there is a color conflict in the decomposition, selectively segmenting the shapes in the decomposition that are associated with the color conflict in order to resolve the conflict.

In a second embodiment, there is a computer-readable storage medium storing computer instructions, which when executed, enables a computing device to decompose a layout for triple patterning lithography. The computer instructions comprise: receiving the layout with pattern features in the layout specified as shapes; building a triple patterning conflict graph that represents the shapes in the layout and coloring constraints associated with the shapes, wherein the triple patterning conflict graph includes a plurality of nodes each representing a plurality of shapes in the layout, conflict arcs coupled to nodes that have color conflicts that arise when the shapes represented by the nodes are assigned to the same color, and stitch arcs coupled to nodes that represent shapes stitched together; decomposing the shapes represented by the triple patterning conflict graph into three colors to avoid color conflicts while balancing color density among the three colors and minimizing a number of stitches used to represent the shapes in the layout; determining whether the decomposition of the shapes into the three colors results in a color conflict; and in response to determining that there is a color conflict in the decomposition, selectively segmenting the shapes in the decomposition that are associated with the color conflict in order to resolve the conflict.

In a third embodiment, there is a system, comprising: at least one computer processor; and at least one memory device operatively coupled to the at least one computer processor. The at least one memory device contains computer instructions that decompose a layout for triple patterning lithography. The computer instructions comprise: receiving the layout with pattern features in the layout specified as shapes; building a triple patterning conflict graph that represents the shapes in the layout and coloring constraints associated with the shapes, wherein the triple patterning conflict graph includes a plurality of nodes each representing a plurality of shapes in the layout, conflict arcs coupled to nodes that have color conflicts that arise when the shapes represented by the nodes are assigned to the same color, and stitch arcs coupled to nodes that represent shapes stitched together; decomposing the shapes represented by the triple patterning conflict graph into three colors to avoid color conflicts while balancing color density among the three colors and minimizing a number of stitches used to represent the shapes in the layout; determining whether the decomposition of the shapes into the three colors results in a color conflict; and in response to determining that there is a color conflict in the decomposition, selectively segmenting the shapes in the decomposition that are associated with the color conflict in order to resolve the conflict.

DETAILED DESCRIPTION

Embodiments of the present invention are directed to a technique that decomposes an integrated circuit ("IC") design layout for triple patterning lithography technology. Triple patterning lithography generally involves placing shapes that are too close to each other to be assigned to the same mask layer, onto three different mask layers in order to satisfy spacing requirements specified in the layout. These different masks can then be used to print one design layer. Thus, given a set of shapes (e.g., polygonal shapes) in a layout, embodiments of the present invention can decompose them into three mask layers, so that no shapes on the same mask layer violate spacing requirements provided in the design rules of the layout. In addition to obtaining a feasible solution that facilitates decomposing a given set of shapes in a layout into three mask layers without violating spacing requirements, embodiments of the present invention can also balance mask density among the three mask layers and minimize the number of stitches (i.e., where two touching segments from the same shapes are assigned to different mask layers) while performing the decomposition.

Triple patterning layout decomposition can be regarded as a three-coloring problem on a conflict graph. As is known in the art and used hereinafter, a mask layer is often referred to as a "color" and mask layers are referred to as "colors". Thus, in a three-coloring problem, a triple patterning conflict graph can be used to represent the constraints associated with coloring (i.e., masking) shapes that are too close to each other to be assigned the same color onto three colors. In particular, the triple patterning conflict graph represents color conflicts (i.e., spacing violations) when shapes in the layout are assigned to the same color. More specifically, in a triple patterning conflict graph, nodes can represent the features of the shapes to be colored and conflict arcs that couple some of the nodes in the graph can represent the color conflicts that may exist when shapes represented by these nodes are assigned to the same color. Coloring the triple patterning conflict graph in three colors so that there is no edge connecting two nodes in the same color is equivalent to a three-coloring problem that is recognized as an NP-complete problem, and possibly an NP-hard problem.

Embodiments of the present invention utilize a customized three-coloring algorithm as described herein to obtain a three-color feasible solution for decomposing shapes in a layout into three colors so that none of the shapes on the same mask layer violate spacing requirements. As used herein, "a three-color feasible solution" is a solution that satisfies all of the constraints in the constrained coloring problem of decomposing shapes in a layout into three colors, so that none of the shapes on the same mask layer violate spacing requirements. At the same time, the three-color feasible solution that is provided by the various embodiments of the present invention can also balance color density of the shapes among the three colors and minimize the number of stitches.

The customized three-coloring algorithm which is described below in more detail generally includes receiving a layout having pattern features specified as polygonal shapes. A triple patterning conflict graph representing the color conflicts that exists between the shapes in the layout is then built. The shapes represented by the triple patterning conflict graph are decomposed into three colors while balancing color density among the three colors and minimizing the number of stitches used to represent the shapes in the layout. If the solution provided by the decomposition is not three-colorable (i.e., there is color conflict), then the shapes in the decomposition that are associated with the color conflict are selectively segmented to resolve the conflict.

Figure 1:
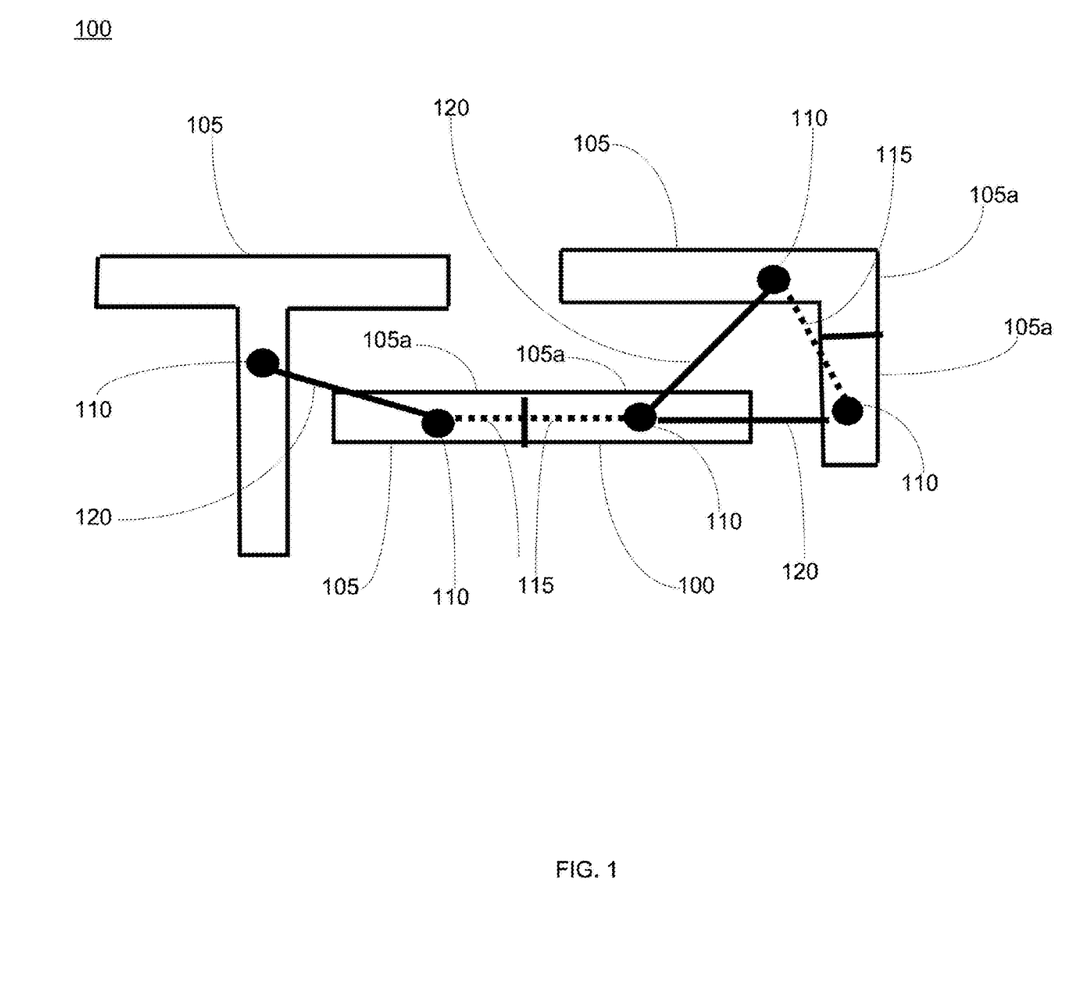
FIG. 1 shows an example of a triple patterning conflict graph that may be built from a layout.

FIG. 1 is an example of a triple patterning conflict graph 100 that may be built from a layout according to one embodiment of the present invention. As shown in FIG. 1, triple patterning conflict graph 100 includes shapes 105 that can take the form of polygonal shapes. For illustrative purposes, shapes 105 are simple polygonal shapes (e.g., a "T" shape, a "straight-line" shape and an "L" shape), and are not meant to limit the various embodiments of the present invention. Each shape 105 in triple patterning conflict graph 100 is represented by a node 110. Some shapes 105 are split into segments 105a so that each can be printed to a different color. In this manner, even though segments 105a are printed in different color overlays they will print to form the continuous segment that they are formed from. Stitch arcs 115 can be used to represent continuous segments 105 that are formed from stitched segments 105a.

In FIG. 1, the straight-line shape 105 and the L shape 105 each show segments 105a that are stitched together to form the continuous segment. Note that each segment 105a is represented by a node. Shapes 105 and their accompanying segments 105a that violate spacing requirements with each other are represented in triple patterning conflict graph 100 by conflict arcs 120. For example, there is a conflict arc 120 between the T shape 105 and the left-segment of the straight-line shape 105. There is also a conflict arc 120 between the top portion of the L shape 105 and the right-segment of the straight-line shape 105. In addition, there is also a conflict arc 120 between the bottom portion of the L shape 105 and the right-segment of the straight-line shape 105. As a result, each of the shapes 105 and segments 105a has to be assigned a different color. In this manner, triple patterning conflict graph 100 can represent a layout and the coloring constraints in a three-color graph. With the layout and coloring constraints converted into a three-color graph such as the one illustrated in FIG. 1, the graph can then be traversed and assigned colors to each node while trying to satisfy the conflict constraints noted in the graph. In addition, each node has a weight which is the area of the shapes the node represents and will be used to compute the color density in the customized three-coloring algorithm described below.

Figure 2:
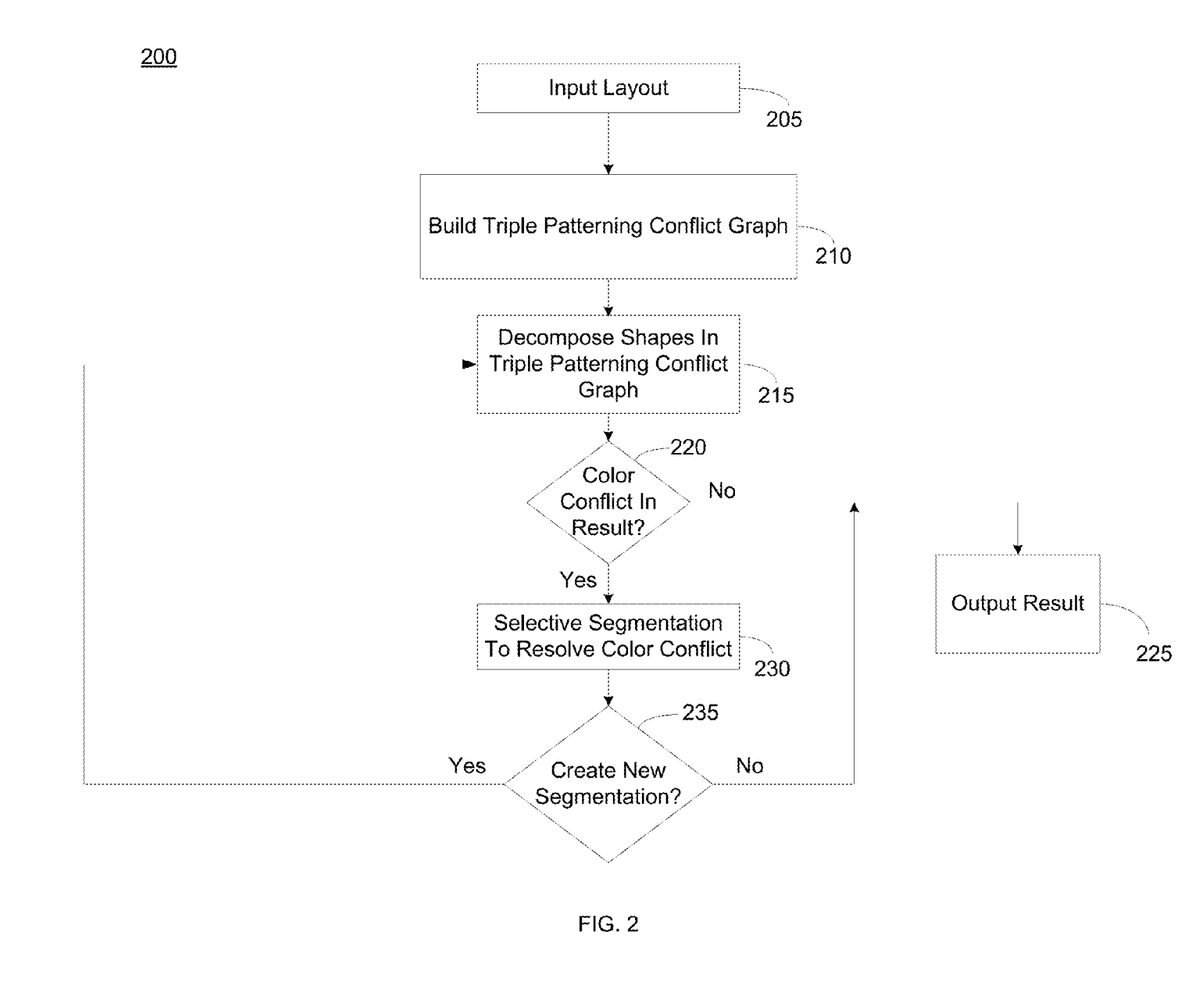
FIG. 2 shows a flow chart describing the process operations of decomposing a layout for triple patterning lithography according to an embodiment of the present invention.

FIG. 2 shows a flow chart 200 describing the process operations of decomposing a layout for triple patterning lithography according to an embodiment of the present invention. In FIG. 2, the process operations described in flow chart 200, which can be performed on a computing device having at least one processing unit begins at 205 where an input design layout is received. The layout can have pattern features specified as a set of shapes (e.g., polygonal shapes). In one embodiment, the layout is received without segmentation. That is, the shapes in the layout are received as unitary parts. For example, a "T" shape pattern feature is received as a vertical portion and a horizontal portion segmented together.

After receiving the layout, a triple patterning conflict graph is built at 210. The triple patterning conflict graph represents the features of the shapes to be colored and the color conflicts (i.e., spacing violations) that may exist when the shapes are assigned to the same color. Like the triple patterning conflict graph depicted in FIG. 1, the graph can have nodes that represent the features of the shapes to be colored, stitch arcs coupled to nodes of shapes that are stitched together, and conflict arcs coupled to the nodes in the graph to represent the color conflicts that may exist when the shapes represented by these nodes are assigned to the same color.

The shapes in the triple patterning conflict graph are then decomposed into three colors at 215. As mentioned below in more detail with reference to FIG. 3, the various embodiments of the present invention utilize a customized three-coloring algorithm to obtain a three-color feasible solution for decomposing shapes in the layout that have been represented in the triple patterning conflict graph into three colors so that none of the shapes on the same color layer violate spacing requirements. While performing the decomposition, the customized three-coloring algorithm can also balance color density of the shapes among the three colors and minimize the number of stitches.

Next, a determination is made at 220 to ascertain whether a color conflict exists in the result generated from the decomposition generated from the customized three-coloring algorithm. If it is determined that there is no color conflict at 220, then the result from the decomposition is considered to be a three-color feasible solution. The three-color feasible solution can then be outputted at 225.

On the other hand, if it is determined at 220 that a color conflict exists, then the shapes in the decomposition that are associated with the color conflict are selectively segmented at 230 in order to resolve the conflict. The selective segmentation includes finding or locating the color conflict in the triple patterning conflict graph and identifying a pair of nodes (candidate nodes) that are coupled by a conflict arc. The shapes represented by those candidate nodes can then be broken or segmented into multiple segments in order to prevent the violation of spacing requirements if these shapes are assigned to the same color layer. These multiple segments can then each be assigned a node. The triple patterning conflict graph can then be rebuilt with the new nodes.

A determination is then made at 235 to ascertain whether this segmentation is new. If it is determined at 235 that this segmentation is not new, then the result is outputted at 225. Those skilled in the art will appreciate that this scenario (i.e., no new segmentation) may arise if there is no way to further segment the shapes due to design rule constraints. On the other hand, if it is determined at 235 that this segmentation is new, then the rebuilt triple patterning conflict graph with this segmentation is applied to the customized three-coloring algorithm so that decomposition can occur at 215. Process operations 220-235 and additional decompositions as performed at 215 are repeated until there is no color conflict in existence or if no new segmentations can be generated in response to attempting to resolve a conflict. Those skilled in the art will recognize that some shapes cannot be segmented. For example, straight line shapes may be segmented, however, non-straight line shapes may be forbidden from being segmented.

Figure 3:
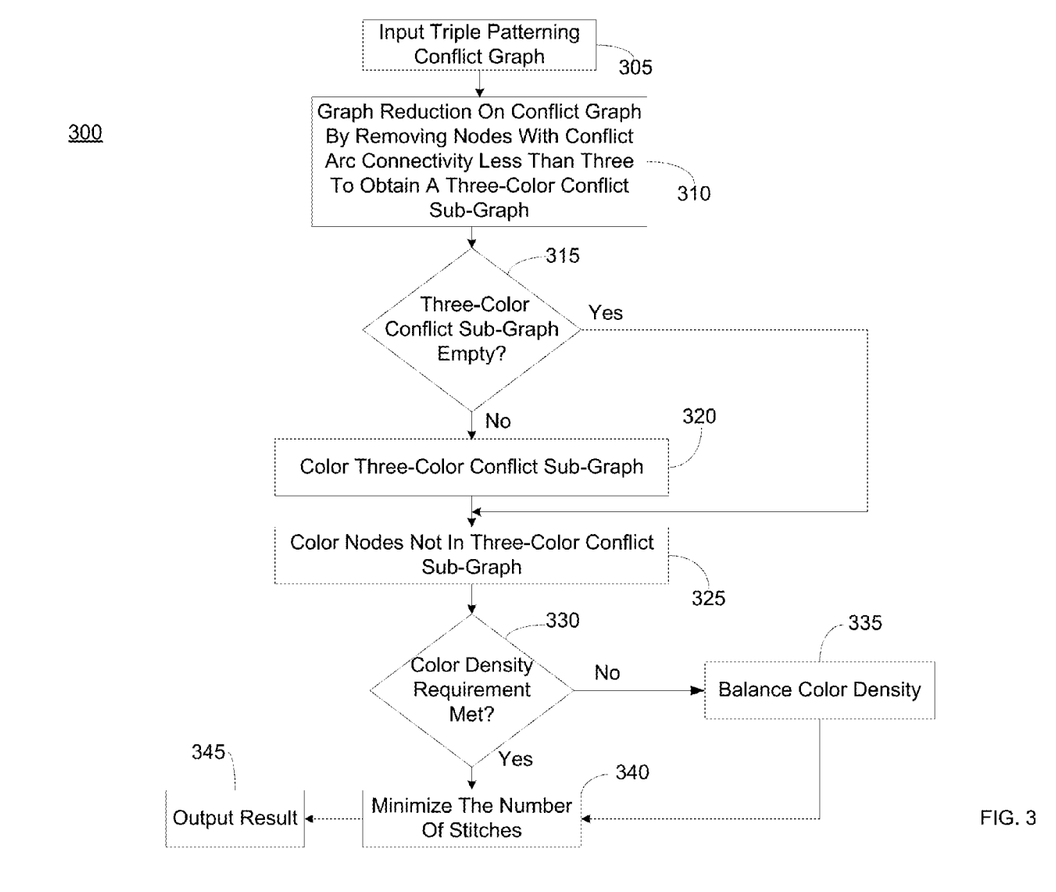
FIG. 3 shows a flow chart describing the process operations associated with a three-coloring algorithm used in the various embodiments of the present invention to decompose a triple patterning conflict graph into three colors.

FIG. 3 shows a flow chart 300 describing the process operations associated with the three-coloring algorithm used in the various embodiments of the present invention to decompose a triple patterning conflict graph into three colors. In FIG. 3, the process operations described in flow chart 300, which can be performed on a computing device having at least one processing unit begins at 305 where an input a triple patterning conflict graph is received. Next, the three-coloring algorithm performs graph reduction on the triple patterning conflict graph at 310. In one embodiment, the graph reduction includes removing nodes from the triple patterning conflict graph that have a conflict arc connectivity of less than three. In particular, all nodes in the triple patterning conflict graph that have less than three conflict arcs coupled thereto are recursively removed from the graph. Generally, all nodes that have a conflict arc connectivity of two or one will typically be colored without conflicts, and thus can be removed from further consideration. Note that in this embodiment, any stitch arcs are not taken into consideration as nodes are evaluated for having a conflict arc connectivity of less than three.

The graph reduction that is performed in this manner at 310 will result in a three-color conflict sub-graph. At 315, the three-color conflict sub-graph is examined to ascertain whether it is empty (i.e., that there is no nodes in the sub-graph). If the three-color conflict sub-graph is not empty, then this sub-graph is colored at 320. More specifically, the three-color conflict sub-graph is decomposed into three colors. In one embodiment, decomposing the three-color conflict sub-graph into three colors includes traversing the sub-graph in a certain order that is based on the connectivity degree of the nodes. For example, the nodes in the three-color conflict sub-graph can be traversed in manner equivalent to a "Dijkstra order," where node degree is used as the weight in a Dijkstra algorithm to traverse the nodes and compute a shortest path between two nodes.

In one embodiment, decomposing the three-color conflict sub-graph into three colors includes selecting a node in the sub-graph that has a highest degree of connectivity with the other nodes in the sub-graph that have a lesser degree of connectivity with the nodes. The node with the highest degree of connectivity is selected because generally it will have the highest potential for having a color conflict with the other nodes. The node in the three-color conflict sub-graph having the highest degree of connectivity is put into a queue and then assigned a color. All uncolored nodes in the three-color conflict sub-graph that connect to the node having the highest degree of connectivity can then be placed into the queue. While the queue is not empty, an uncolored node from the queue that has a highest degree of connectivity with the other nodes in the three-color conflict sub-graph can then be selected. Then, it is determined whether the uncolored node selected from the queue that has a highest degree of connectivity can be colored without introducing a color conflict. If it is determined that a color can be introduced without having a color conflict, then a non-conflicted color is assigned to the uncolored node from the queue that has a highest degree of connectivity while trying to balance the color density. On the other hand, if it is determined that introducing a color will have a color conflict, then a conflicted color is assigned to the uncolored node from the queue that has a highest degree of connectivity so that the color density is more balanced.

In one embodiment, the balancing of the color density can be performed according to this formula where the color density of a color, $C_i$, (i=1, 2, 3) is the percentage of the weight of nodes that are assigned to color $C_i$ in terms of the total weight of all the nodes in the conflict graph:

$$\text{density}(C_i) = \frac{\sum\limits_{color(node_v)=C_i} \text{weight}(node_v)}{\sum\limits_{node_u \in CG} \text{weight}(node_u)} \quad i = 1, 2, 3 \qquad \text{Equation (1)}$$

wherein weight($node_v$) denotes the weight of the node $node_v$, which corresponds to the areas of the shapes the node represents, color($node_v$) denotes the color assigned to a node, $node_v$, the $$\sum_{color(node_v)=C_i} \text{weight}(node_v)$$

is the sum of the weight of nodes that are assigned to color $C_i$, and the $$\sum_{node_u \in CG} \text{weight}(node_u)$$

is the sum of the total weights of all nodes in the conflict graph. In one embodiment, the value of density($C_i$) is updated whenever a node is assigned to the color $C_i$. When deciding what color to assign a node in order to balance the color density, the color with the least value of density($C_i$) is chosen.

After the node with the highest degree of connectivity has been evaluated in the aforementioned manner, it can then be removed from the queue. The uncolored nodes connected to the removed node can then be added into the queue. The remaining nodes in the queue can then be processed according to node connectivity in the aforementioned manner. When the queue becomes empty, but there are still uncolored nodes, the uncolored node with the highest degree of connectivity can then be chosen and put to the queue. The process then continues until the queue is empty and all of the nodes in the three-color conflict sub-graph have been colored.

Referring back to FIG. 3, if the three-color conflict sub-graph is empty as determined at 315, then the nodes not in the three-color conflict sub-graph are colored at 325. In particular, the shapes associated with the nodes that have been removed from the triple patterning conflict graph at 310 are decomposed into the three colors. In one embodiment, decomposing the shapes associated with the nodes that have been removed from the triple patterning conflict graph at 310 can include selecting a node in the triple patterning conflict graph with one or two colored nodes. A non-conflicted color can then be assigned to the selected node from the triple patterning conflict graph having one or two colored nodes. The color density of the non-conflicted color can then be balanced per equation 1. Note that the process operations performed at 325 can also be undertaken upon completing the coloring of the three-color conflict sub-graph at 320.

The next action performed in flow chart 300 occurs at 330 where a determination is made to ascertain whether a color density balance requirement has been met. In one embodiment, the color density balances associated with the decompositions performed at 320 and 325 can be compared to a predetermined color density balance requirement. In one embodiment, a predetermined color density balance requirement could entail having a color density balance for each of the three colors that ranges from about 25% to about 33%. Those skilled in the art will recognize that the selection of the predetermined color density balance requirement will depend on the layout.

If the predetermined color density balance requirement is not met as determined at 330, then the color density of the decomposed three colors can be balanced at 335 until the color density requirement has been fulfilled. In one embodiment, improving color density balance may occur by selecting a node with one degree of connectivity and changing its color to obtain a better color density without introducing a color conflict. In one embodiment, color density can be determined in this operation per equation 1.

Once the predetermined color density requirement has been met as ascertained at 330, then the number of stitches used in the decomposed three colors can be minimized at 340. In one embodiment, the number of stitches decomposed into the three colors can be minimized by finding a pair of colored nodes in the triple patterning conflict graph that are coupled by a stitch arc and assigned different colors. The pair of colored nodes is assigned to the same color upon determining whether assigning the pair of colored nodes to the same color will introduce a color conflict. If it is determined that a color conflict is nonexistent when assigning the pair of nodes to the same color, then the pair of colored nodes are changed to the same color, thereby reducing the stitch by one. On the other hand, if it is determined that a color conflict exists when assigning the pair of nodes to the same color, then the color is not changed.

After the number of stitches in the decomposition has been minimized, then flow chart 300 outputs the results of the three colors at 345. The result from this three-coloring algorithm described in FIG. 3 is inputted to FIG. 2 at process operation 220 where the result is examined to determine whether a three-color feasible solution exists.

The foregoing flow charts set forth in FIGS. 2-3 shows some of the processing functions associated with performing a layout decomposition for triple patterning lithography according to the various embodiments of the present invention. In this regard, each block represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the processing functions may be added.

Figure 4A:
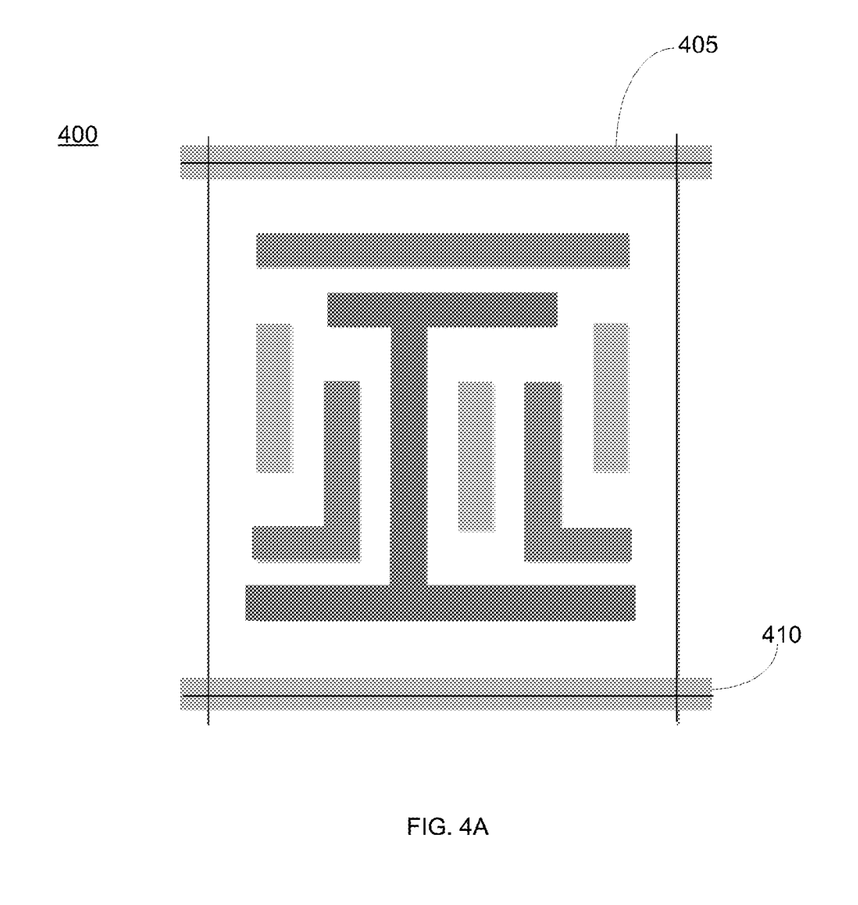
FIGS. 4A-4B show an example of a portion of decomposing a layout for a first metal level (M1) having pre-colored shapes.
Figure 4B:
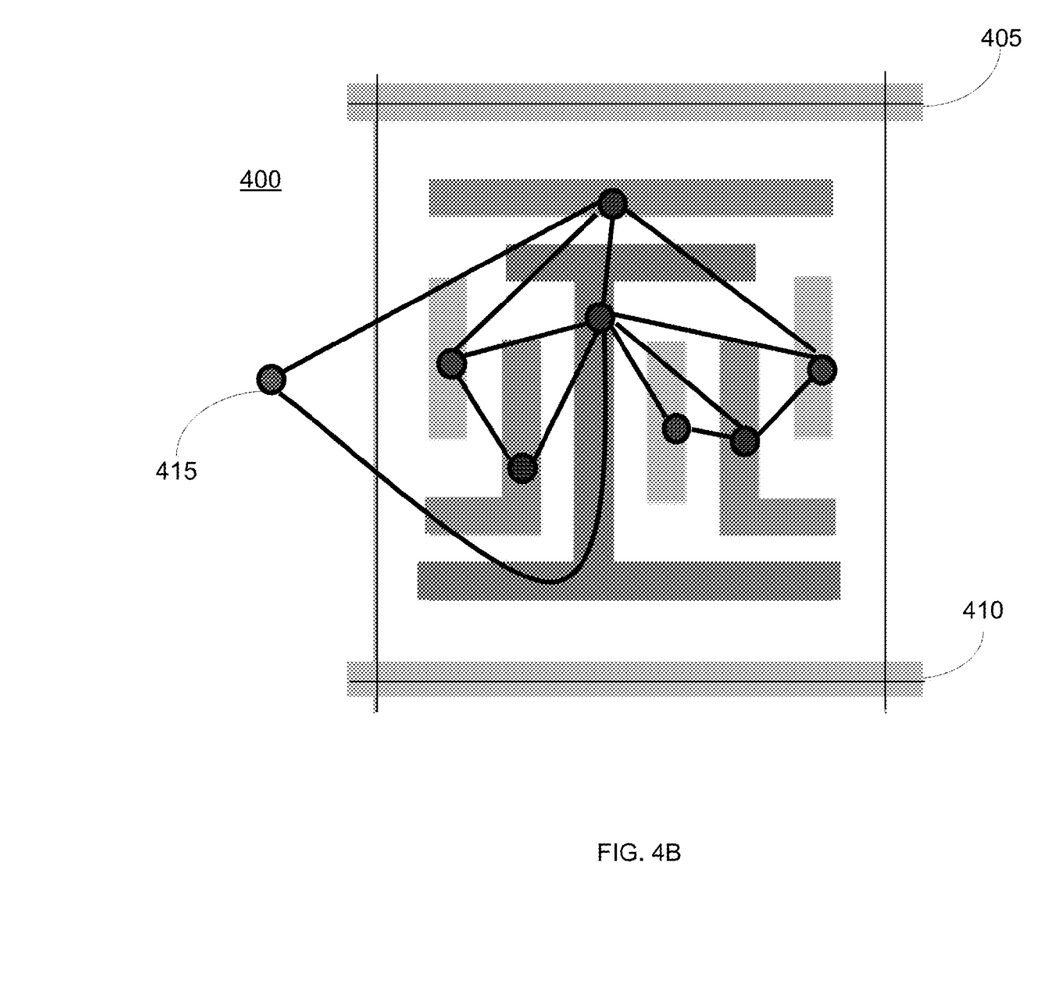

The various embodiments of the present invention are also adapted to decompose a layout for triple patterning lithography in instances in which the layout includes pre-colored shapes. As used herein, a pre-colored shape is a shape in the layout that has been previously assigned a color. These pre-colored shapes are sometimes referred to as anchor-shapes. FIGS. 4A-4B show an example of a portion of decomposing a layout for a first metal level (M1) having pre-colored shapes. Those skilled in the art will recognize that layout 400 in FIGS. 4A-4B is only an example and is not meant to limit the various embodiments of the present invention. As shown in FIGS. 4A-4B, layout 400 includes a top shape 405 and a bottom shape 410 that are pre-colored in the same color. The various other shapes in layout 400 that are located between top shape 405 and bottom shape 410 are not pre-colored. The various embodiments of the present invention provide a methodology for performing a decomposition that honors the pre-coloring of the pre-colored shapes in the layout while decomposing the non-pre-colored shape to a color in the aforementioned manner.

Decomposing a layout for triple patterning lithography in instances in which the layout includes pre-colored shapes is similar to the methodology described above with respect to FIGS. 2-3, except that the handling of the pre-colored shapes involves some additional processing. For example, when a layout has pre-colored shapes, the various embodiments of the present invention can build the triple patterning conflict graph by using at most three nodes referred to herein as artificial nodes to represent all of the pre-colored shapes. In one embodiment, each artificial node represents all the pre-colored nodes in the same color. Because triple patterning is involved, each of the three artificial nodes corresponds to one color. For example if the three colors are referred to as red, yellow and blue, then their corresponding artificial nodes are referred as $node_{red}$, $node_{yellow}$ and $node_{blue}$. Artificial color conflict arcs are then added between the three artificial nodes so that they will be assigned to different colors by the three-coloring algorithm. For example, the artificial node 415 (FIG. 4B) represents all of the pre-colored shapes 405 and 410 with the same color in the triple patterning conflict graph.

After adding an artificial node 415 to the triple patterning conflict graph, any color conflicts between top shape 405 and other shapes are added as conflict arcs between the artificial node 415 and the corresponding nodes in the triple patterning conflict graph. This applies similarly for the color conflict between bottom shape 410 and other shapes. In addition, conflict arcs are added to the triple patterning conflict graph for those shapes that have not been pre-colored in order to complete the conflict graph (FIG. 4B). The triple patterning conflict graph can then be decomposed in the manner described above for FIGS. 2-3 (e.g., graph reduction by removing conflict arc connectivity less than three, forming a sub-graph, coloring the sub-graph, coloring nodes not in the sub-graph, balancing color density, etc.). After obtaining the color result for each node in the conflict graph, as denoted as $color(node_u)$ for each node $node_u$, a simple assignment procedure is performed in order to honor the pre-coloring of the pre-colored nodes: $color(node_{red})$=red, $color(node_{yellow})$=yellow, $color(node_{blue})$=blue. In this manner, the shapes in the triple patterning conflict graph can be decomposed into three colors, while honoring or ensuring that the pre-colored shapes are assigned to their previously assigned color.

Figure 5:
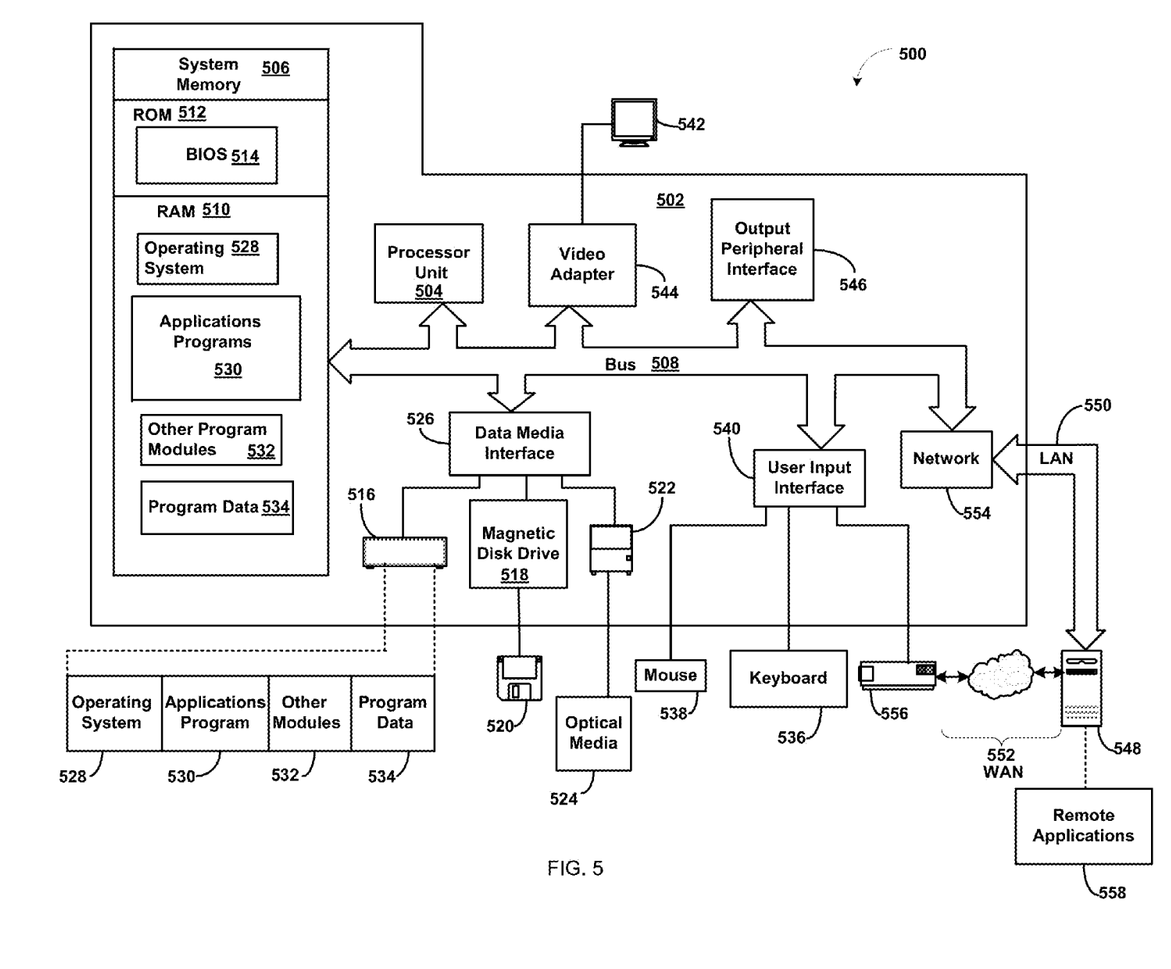
FIG. 5 shows a schematic of an exemplary computing environment in which embodiments of the present invention may operate.

FIG. 5 shows a schematic of an exemplary computing environment which may perform the operations described with reference to FIGS. 2-3. The exemplary computing environment 500 is only one example of a suitable computing environment and is not intended to suggest any limitation as to the scope of use or functionality of the approach described herein. Neither should the computing environment 500 be interpreted as having any dependency or requirement relating to any one or combination of components illustrated in FIG. 5.

In the computing environment 500 there is a computer 502 which is operational with numerous other general purpose or special purpose computing system environments or configurations. As shown in FIG. 5, the computer 502 in the computing environment 500 is shown in the form of a general-purpose computing device. The components of computer 502 may include, but are not limited to, one or more processors or processing units 504, a system memory 506, and a bus 508 that couples various system components including the system memory 506 to the processor 504.

In FIG. 5, the system memory 506 includes computer readable media in the form of volatile memory, such as random access memory (RAM) 510, and/or non-volatile memory, such as ROM 512. A BIOS 514 containing the basic routines that help to transfer information between elements within computer 502, such as during start-up, is stored in ROM 512. RAM 510 typically contains data and/or program modules that are immediately accessible to and/or presently operated on by processor 504.

Computer 502 may further include other removable/non-removable, volatile/non-volatile computer storage media. By way of example only, FIG. 5 illustrates a hard disk drive 516 for reading from and writing to a non-removable, non-volatile magnetic media (not shown and typically called a "hard drive"), a magnetic disk drive 518 for reading from and writing to a removable, non-volatile magnetic disk 520 (e.g., a "floppy disk"), and an optical disk drive 522 for reading from or writing to a removable, non-volatile optical disk 524 such as a CD-ROM, DVD-ROM or other optical media. The hard disk drive 516, magnetic disk drive 518, and optical disk drive 522 are each connected to bus 508 by one or more data media interfaces 526.

The drives and their associated computer-readable media provide nonvolatile storage of computer readable instructions, data structures, program modules, and other data for computer 502. Although the exemplary environment described herein employs a hard disk 516, a removable magnetic disk 518 and a removable optical disk 522, it should be appreciated by those skilled in the art that other types of computer readable media which can store data that is accessible by a computer, such as magnetic cassettes, flash memory cards, digital video disks, RAMs, ROM, and the like, may also be used in the exemplary operating environment.

A number of program modules may be stored on the hard disk 516, magnetic disk 520, optical disk 522, ROM 512, or RAM 510, including, by way of example, and not limitation, an operating system 528, one or more application programs 530, other program modules 532, and program data 534. Each of the operating system 528, one or more application programs 530 other program modules 532, and program data 534 or some combination thereof, may include an implementation of the aforementioned customized three-coloring algorithm.

A user may enter commands and information into computer 502 through optional input devices such as a keyboard 536 and a pointing device 538 (such as a "mouse"). These and other input devices are connected to the processor unit 504 through a user input interface 540 that is coupled to bus 508, but may be connected by other interface and bus structures, such as a parallel port, game port, or a universal serial bus (USB).

An optional monitor 542 or other type of display device can also be connected to bus 508 via an interface, such as a video adapter 544. In addition to the monitor, personal computers typically include other peripheral output devices (not shown), such as speakers and printers, which may be connected through output peripheral interface 546.

Computer 502 may operate in a networked environment using logical connections to one or more remote computers, such as a remote server/computer 548. Remote computer 548 may include many or all of the elements and features described herein relative to computer 502.

Logical connections shown in FIG. 5 are a local area network (LAN) 550 and a general wide area network (WAN) 552. Such networking environments are commonplace in offices, enterprise-wide computer networks, intranets, and the Internet. When used in a LAN networking environment, the computer 502 may be connected to LAN 550 via network interface or adapter 554. When used in a WAN networking environment, the computer typically includes a modem 556 or other means for establishing communications over the WAN 552. The modem, which may be internal or external, may be connected to the system bus 508 via the user input interface 540 or other appropriate mechanism.

In a networked environment, program modules depicted relative to the computer 502, or portions thereof, may be stored in a remote memory storage device. By way of example, and not limitation, FIG. 5 illustrates remote application programs 558 as residing on a memory device of remote computer 548.

The operations described above can be implemented in an entirely hardware embodiment, an entirely software embodiment or an embodiment containing both hardware and software elements. In one embodiment, the process operations are performed on a general-purpose computer and are implemented in software, which includes but is not limited to firmware, resident software, microcode, etc.

In another embodiment, the process operations can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the computer, instruction execution system, apparatus, or device. The computer readable medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include a compact disk-read only memory (CD-ROM), a compact disk-read/write (CD-R/W) and a digital video disc (DVD).

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A method, performed on a computing device having at least one processing unit, that decomposes a layout for triple patterning lithography, comprising:
   using the at least one processing unit of the computing device to perform actions comprising:
      receiving the layout with pattern features in the layout specified as shapes;
      building a triple patterning conflict graph that represents the shapes in the layout and coloring constraints associated with the shapes, wherein the triple patterning conflict graph includes a plurality of nodes each representing a plurality of shapes in the layout, conflict arcs coupled to nodes that have color conflicts that arise when the shapes represented by the nodes are assigned to the same color, and stitch arcs coupled to nodes that represent shapes stitched together;
      decomposing the shapes represented by the triple patterning conflict graph into three colors to avoid color conflicts while balancing color density among the three colors and minimizing a number of stitches used to represent the shapes in the layout;
      determining whether the decomposition of the shapes into the three colors results in a color conflict; and
      in response to determining that there is a color conflict in the decomposition, selectively segmenting the shapes in the decomposition that are associated with the color conflict in order to resolve the conflict.

2. The method according to claim 1, wherein the decomposing of the shapes represented by the triple patterning conflict graph into three colors comprises:
   removing nodes in the triple patterning conflict graph that have a conflict arc connectivity of less than three;
   forming a three-color conflict sub-graph for those shapes whose representing nodes remain after removing nodes that have a conflict arc connectivity of less than three;
   decomposing the shapes represented by the three-color conflict sub-graph into three colors; and
   decomposing the shapes associated with the nodes that have been removed from the triple patterning conflict graph into three colors.

3. The method according to claim 2, further comprising:
   determining whether the decomposed three colors fulfills a predetermined color density requirement; and
   balancing the color density of the decomposed three colors to fulfill the predetermined color density requirement in response to determining that the predetermined color density requirement is unfulfilled.

4. The method according to claim 3, further comprising minimizing the number of stitches used in the decomposed three colors in response to balancing the color density to fulfill the predetermined color density requirement.

5. The method according to claim 2, wherein the decomposing of the shapes represented by the three-color conflict sub-graph into three colors comprises:
- selecting an uncolored node in the three-color conflict sub-graph that has a highest degree of conflict arc connectivity with the other nodes in the three-color conflict sub-graph;
- assigning a color to the uncolored node in the three-color conflict sub-graph having the highest degree of conflict arc connectivity;
- placing all uncolored nodes in the three-color conflict sub-graph that connect to the node having the highest degree of conflict arc connectivity into a queue;
- selecting an uncolored node from the queue that has a highest degree of conflict arc connectivity with the other nodes in the three-color conflict sub-graph;
- determining whether the uncolored node from the queue that has the highest degree of conflict arc connectivity can be colored without introducing a color conflict;
- assigning a non-conflicted color to the uncolored node from the queue that has the highest degree of conflict arc connectivity while trying to balance color density, in response to determining that a color can be introduced without having a color conflict; and
- assigning a conflicted color to the uncolored node from the queue that has the highest degree of conflict arc connectivity in response to determining that introducing a color will have a color conflict, wherein the assigned conflicted color balances color density.

6. The method according to claim 5, further comprising:
- removing the node having the highest degree of conflict arc connectivity from the queue; and
- adding uncolored nodes connected to the removed node into the queue.

7. The method according to claim 5, wherein the balancing of the color density is performed according to the following formula where the color density of a color, $C_i$, ($i=1, 2, 3$) is the percentage of the weight of nodes that are assigned to color $C_i$ in terms of the total weight of all the nodes in the conflict graph:

$$\text{density}(C_i) = \frac{\sum_{color(node_v)=C_i} \text{weight}(node_v)}{\sum_{node_u \in CG} \text{weight}(node_u)} \quad i = 1, 2, 3$$

wherein
weight($node_v$) denotes the weight of the node $node_v$, which correspond to the areas of the shapes the node represents, color($node_v$) denotes the color assigned to a node, $node_v$, the $$\sum_{color(node_v)=C_i} \text{weight}(node_v)$$

is the sum of the weight of nodes that are assigned to color $C_i$, and the $$\sum_{node_u \in CG} \text{weight}(node_u)$$

is the sum of the total weights of all nodes in the conflict graph.

8. The method according to claim 2, wherein the decomposing of the shapes associated with the nodes that have been removed from the triple patterning conflict graph into three colors comprises:
- selecting a node in the triple patterning conflict graph with one or two colored nodes;
- assigning a non-conflicted color to the selected node from the triple patterning conflict graph having one or two colored nodes; and
- balancing color density of the non-conflicted color in response to assignment thereof.

9. The method according to claim 8, wherein the balancing of the color density of the non-conflicted color is performed according to the following formula where the color density of a color, $C_i$, ($i=1, 2, 3$) is the percentage of the weight of nodes that are assigned to color $C_i$ in terms of the total weight of all the nodes in the conflict graph:

$$\text{density}(C_i) = \frac{\sum_{color(node_v)=C_i} \text{weight}(node_v)}{\sum_{node_u \in CG} \text{weight}(node_u)} \quad i = 1, 2, 3$$

wherein
weight($node_v$) denotes the weight of the node $node_v$, which correspond to the areas of the shapes the node represents, color($node_v$) denotes the color assigned to a node, $node_v$, the $$\sum_{color(node_v)=C_i} \text{weight}(node_v)$$

is the sum of the weight of nodes that are assigned to color $C_i$, and the $$\sum_{node_u \in CG} \text{weight}(node_u)$$

is the sum of the total weights of all nodes in the conflict graph.

10. The method according to claim 1, wherein minimizing the number of stitches decomposed into the three colors comprises:
- finding a pair of colored nodes in the triple patterning conflict graph that are coupled by a stitch arc and assigned different colors;
- determining whether assigning the pair of colored nodes to the same color will introduce a color conflict; and
- changing the pair of colored nodes to the same color in response to determining that a color conflict is nonexistent.

11. The method according to claim 1, further comprising:
- representing any pre-colored shapes in the same color in the layout with one artificial node in the three-color conflict graph;
- adding artificial conflict arcs between the artificial node so that they must be assigned in different colors;
- adding conflict arcs between the artificial node and the nodes in the triple patterning conflict graph; and decomposing the shapes represented by the triple patterning conflict graph into three colors while honoring the pre-coloring of the pre-colored shapes.

12. The method according to claim 1, wherein the selectively of segmenting of the shapes in the decomposition to resolve the conflict comprises:
   finding a pair nodes in the decomposition that are coupled by a conflict arc;
   breaking the shapes associated with at least one of the pair of nodes into multiple segments;
   assigning a node to each of the multiple segments;
   rebuilding the three-color conflict graph with the multiple segments; and
   decomposing the shapes and the multiple segments in the triple patterning conflict graph into the three colors.

13. A computer-readable storage medium storing computer instructions, which when executed, enables a computing device to decompose a layout for triple patterning lithography, the computer instructions comprising:
   receiving the layout with pattern features in the layout specified as shapes;
   building a triple patterning conflict graph that represents the shapes in the layout and coloring constraints associated with the shapes, wherein the triple patterning conflict graph includes a plurality of nodes each representing a plurality of shapes in the layout, conflict arcs coupled to nodes that have color conflicts that arise when the shapes represented by the nodes are assigned to the same color, and stitch arcs coupled to nodes that represent shapes stitched together;
   decomposing the shapes represented by the triple patterning conflict graph into three colors to avoid color conflicts while balancing color density among the three colors and minimizing a number of stitches used to represent the shapes in the layout;
   determining whether the decomposition of the shapes into the three colors results in a color conflict; and
   in response to determining that there is a color conflict in the decomposition, selectively segmenting the shapes in the decomposition that are associated with the color conflict in order to resolve the conflict.

14. The computer-readable storage medium according to according to claim 13, wherein the decomposing of the shapes represented by the triple patterning conflict graph into three colors comprises:
   removing nodes in the triple patterning conflict graph that have a conflict arc connectivity of less than three;
   forming a three-color conflict sub-graph for those shapes whose representing nodes remain after removing nodes that have a conflict arc connectivity of less than three;
   decomposing the shapes represented by the three-color conflict sub-graph into three colors; and
   decomposing the shapes associated with the nodes that have been removed from the triple patterning conflict graph into three colors according to a specified coloring order.

15. The computer-readable storage medium according to according to claim 14, further comprising:
   determining whether the decomposed three colors fulfills a predetermined color density requirement; and
   balancing the color density of the decomposed three colors to fulfill the predetermined color density requirement in response to determining that the predetermined color density requirement is unfulfilled.

16. The computer-readable storage medium according to claim 14, wherein the decomposing of the shapes represented by the three-color conflict sub-graph into three colors comprises:
   selecting an uncolored node in the three-color conflict sub-graph that has a highest degree of conflict arc connectivity with the other nodes in the three-color conflict sub-graph;
   assigning a color to the uncolored node in the three-color conflict sub-graph having the highest degree of conflict arc connectivity;
   placing all uncolored nodes in the three-color conflict sub-graph that connect to the node having the highest degree of conflict arc connectivity into a queue;
   selecting an uncolored node from the queue that has a highest degree of conflict arc connectivity with the other nodes in the three-color conflict sub-graph;
   determining whether the uncolored node from the queue that has the highest degree of conflict arc connectivity can be colored without introducing a color conflict;
   assigning a non-conflicted color to the uncolored node from the queue that has the highest degree of conflict arc connectivity while trying to balance color density, in response to determining that a color can be introduced without having a color conflict; and
   assigning a conflicted color to the uncolored node from the queue that has the highest degree of conflict arc connectivity in response to determining that introducing a color will have a color conflict, wherein the assigned conflicted color balances color density.

17. The computer-readable storage medium according to claim 16, further comprising:
   removing the node having the highest degree of conflict arc connectivity from the queue; and
   adding uncolored nodes connected to the removed node into the queue.

18. The computer-readable storage medium according to claim 16, wherein the balancing of the color density of the conflicted color is performed according to the following formula where the color density of a color, $C_i$, (i=1, 2, 3) is the percentage of the weight of nodes that are assigned to color $C_i$ in terms of the total weight of all the nodes in the conflict graph:

$$\text{density}(C_i) = \frac{\sum_{color(node_v)=C_i} \text{weight}(node_v)}{\sum_{node_u \in CG} \text{weight}(node_u)} \quad i=1, 2, 3$$

wherein
   weight($node_v$) denotes the weight of the node $node_v$, which correspond to the areas of the shapes the node represents, color($node_v$) denotes the color assigned to a node, $node_v$, the $$\sum_{color(node_v)=C_i} \text{weight}(node_v)$$

is the sum of the weight of nodes that are assigned to color $C_i$, and the $$\sum_{node_u \in CG} \text{weight}(node_u)$$

is the sum or the total weights of all nodes in the conflict graph.

19. The computer-readable storage medium according to claim 14, wherein the decomposing of the shapes associated with the nodes that have been removed from the triple patterning conflict graph into three colors comprises:
  selecting a node in the triple patterning conflict graph with one or two colored nodes;
  assigning a non-conflicted color to the selected node from the triple patterning conflict graph having one or two colored nodes; and
  balancing color density of the non-conflicted color in response to assignment thereof.

20. A system, comprising: at least one computer processor; and at least one memory device operatively coupled to the at least one computer processor, the at least one memory device containing computer instructions that decompose a layout for triple patterning lithography, the computer instructions comprising:
  receiving the layout with pattern features in the layout specified as shapes;
  building a triple patterning conflict graph that represents the shapes in the layout and coloring constraints associated with the shapes, wherein the triple patterning conflict graph includes a plurality of nodes each representing a shape in the layout, conflict arcs coupled to nodes that have color conflicts that arise when the shapes represented by the nodes are assigned to the same color, and stitch arcs coupled to nodes that represent shapes stitched together;
  decomposing the shapes represented by the triple patterning conflict graph into three colors to avoid color conflicts while balancing color density among the three colors and minimizing a number of stitches used to represent the shapes in the layout;
  determining whether the decomposition of the shapes into the three colors results in a color conflict; and
  in response to determining that there is a color conflict in the decomposition, selectively segmenting the shapes in the decomposition that are associated with the color conflict in order to resolve the conflict.

* * * * *